US012568603B2

(12) United States Patent
    Chehade et al.

(10) Patent No.:    US 12,568,603 B2
(45) Date of Patent:        Mar. 3, 2026

(54) COOLING BLOCK ASSEMBLY FOR COOLING A HEAT-GENERATING ELECTRONIC COMPONENT

(71) Applicant: OVH, Roubaix (FR)

(72) Inventors: Ali Chehade, Moncheaux (FR);
                Hadrien Bauduin, Villeneuve d'Ascq (FR)

(73) Assignee: OVH, Roubaix (FR)

( * ) Notice: Subject to any disclaimer, the term of this patent is extended or adjusted under 35 U.S.C. 154(b) by 600 days.

(21) Appl. No.: 17/992,756

(22) Filed: Nov. 22, 2022

(65) Prior Publication Data

US 2023/0171926 A1        Jun. 1, 2023

(30) Foreign Application Priority Data

Nov. 29, 2021    (EP) ..................................... 21306655
Aug. 30, 2022    (EP) ..................................... 22306283

(51) Int. Cl.
    *F28F 3/12*        (2006.01)
    *F28D 1/03*        (2006.01)
    *H05K 7/20*        (2006.01)

(52) U.S. Cl.
    CPC ......... *H05K 7/20254* (2013.01); *F28D 1/035* (2013.01); *F28F 3/12* (2013.01)

(58) Field of Classification Search
    CPC ............ H05K 7/20254; H05K 7/20509; H01L 2023/4068; F28F 3/12
    See application file for complete search history.

(56) References Cited

U.S. PATENT DOCUMENTS 6,664,627 B2    12/2003    Cheon
7,077,189 B1    7/2006    Reyzin et al.
              (Continued)

FOREIGN PATENT DOCUMENTS

CN        201156860        11/2008
CN        102342192 A        2/2012
              (Continued)

OTHER PUBLICATIONS

Notice of Allowance with regard to te counterpart U.S. Appl. No. 17/992,752, filed Sep. 30, 2024.
              (Continued)

*Primary Examiner* — Jianying C Atkisson
*Assistant Examiner* — Khaled Ahmed Ali Al Samiri
(74) *Attorney, Agent, or Firm* — BCF LLP

(57)        ABSTRACT

A cooling block assembly for cooling a heat-generating electronic component includes: an upper block portion defining at least one internal fluid conduit and having a lower surface configured to face toward the heat-generating electronic component; a boss spaced from the lower surface and having a thermal transfer surface configured to be in thermal contact with the heat-generating electronic component, the thermal transfer surface being offset from the lower surface, a periphery of the thermal transfer surface being smaller than a periphery of the upper block portion, the periphery of the thermal transfer surface being contained within the periphery of the upper block portion in a projection thereof on a plane parallel to the thermal transfer surface; and heat distributing devices for distributing heat through a phase change of a working substance contained therein, each heat distributing device being disposed partially between the boss and the lower surface.

13 Claims, 8 Drawing Sheets

(56) References Cited

U.S. PATENT DOCUMENTS

| 7,661,463 | B2 | 2/2010 | Liu |
|---|---|---|---|
| 10,136,552 | B2 | 11/2018 | Zheng et al. |
| 10,327,355 | B2 | 6/2019 | Lin |
| 10,809,776 | B2 | 10/2020 | Lee |
| 10,932,391 | B2 | 2/2021 | Tsai |
| 11,800,682 | B2 | 10/2023 | Lunsman et al. |
| 2008/0264608 | A1 | 10/2008 | Tye et al. |
| 2009/0065178 | A1 | 3/2009 | Kasezawa et al. |
| 2009/0151905 | A1 | 6/2009 | Lai et al. |
| 2013/0168068 | A1 | 7/2013 | Huang et al. |
| 2016/0061364 | A1 | 3/2016 | Brunschwiler et al. |
| 2016/0330868 | A1* | 11/2016 | Sun .......................... H01L 23/46 |
| 2017/0115071 | A1 | 4/2017 | Lin |
| 2019/0234691 | A1 | 8/2019 | Lin |
| 2020/0373223 | A1 | 11/2020 | Chehade et al. |
| 2021/0164738 | A1 | 6/2021 | Klaba et al. |
| 2021/0378147 | A1 | 12/2021 | Chehade et al. |
| 2022/0071056 | A1 | 3/2022 | Lin et al. |
| 2023/0189488 | A1 | 6/2023 | Chehade et al. |
| 2024/0258199 | A1* | 8/2024 | Nie .......................... G06F 1/206 |

FOREIGN PATENT DOCUMENTS

| CN | 108279759 A | 7/2018 |
|---|---|---|
| EP | 3620741 | 3/2020 |
| GB | 2449951 | 12/2008 |
| WO | 2021129692 A1 | 7/2021 |

OTHER PUBLICATIONS

Attia, "Experimental investigation of vapor chamber with different working fluids at different charge ratios", Ain Shams Engineering Journal, (2012) 3, retrieved on Aug. 2, 2021 from https://www.sciencedirect.com/science/article/pii/S2090447912000147, pp. 289-297.

Jiang, "3D Heat Transfer Analysis of a Miniature Copper-Water Vapor Chamber with Wicked Pillars Array", Research Article, Hindawi Publishing Corporation, retrieved on Aug. 2, 2021 from https://www.hindawi.com/journals/isrn/2013/194908/, pp. 1-10.

English Abstract for CN201156860 retrieved on Espacenet on Nov. 21, 2022.

Extended European Search Report with regard to EP21306655.8 completed May 24, 2022.

"50x50x15mm Pure Copper Base", 50x50x15mm Pure Copper Base Water Cooling Block Waterblock for CPU Cooler, EBAY, https://www.ebay.com/itm/50x50x15mm-Pure-Copper-Base-Water-Cooling-Block-Waterblock-for-CPU-Cooler-/223271358240?_ul=IL, provided Jul. 21, 2021, pdf 4 pages.

"GPU Water Block Water Cooling Cooler Base", Amazon, https://www.amazon.com/Cooling-Cooler-Copper-Waterway-Component/dp/B07KZVQMNC, provided Jul. 21, 2021, 8 pages.

"Aveks CPU Water Cooling Block Waterblock", Aveks CPU Water Cooling Block Waterblock 50mm Copper Base, Amazon, https://www.amazon.com/Water-Cooling-Waterblock-Copper-Channel/dp/B013JD2CVO, provided Jul. 21, 2021, 10 pages.

"Bewinner PC Water Cooling Block", Amazon, https://www.amazon.com/Bewinner-Waterblock-Processed-Anti-Oxidization-Technology/dp/B07TMZQ56R, provided Jul. 21, 2021, 8 pages.

"Water Cooling Block, Richer-R Mini South Bridge", Amazon, https://www.amazon.com/Richer-R-Computer-4-4-5-8CM-4-4-5-8cm-Mainboard/dp/B07DCKHXBY, provided Jul. 21, 2021, 7 pages.

Office Action with regard to the counterpart CN Patent Application No. 2022115032122 issued Jan. 11, 2025.

* cited by examiner

COOLING BLOCK ASSEMBLY FOR COOLING A HEAT-GENERATING ELECTRONIC COMPONENT

CROSS-REFERENCE

The present application claims priority from European Patent Application No. 21306655.8, filed on Nov. 29, 2021, and from European Patent Application No. 22306283.7, filed on Aug. 30, 2022, the entirety of both of which being incorporated by reference herein.

FIELD OF TECHNOLOGY

The present technology relates to liquid cooling assemblies and methods and systems for assembly thereof.

BACKGROUND

Heat dissipation is an important consideration for computer systems. Notably, many components of a computer system, such as a processor (also referred to as central processing unit (CPU)), generate heat and thus require cooling to avoid performance degradation and, in some cases, failure. Similar considerations arise for systems other than computer systems (e.g., power management systems). Thus, in many cases, different types of cooling solutions are implemented to promote heat dissipation from heat-generating electronic components, with the objective being to collect and conduct thermal energy away from these heat-generating electronic components. For instance, in a data center, in which multiple electronic systems (e.g., servers, networking equipment, power equipment) are continuously operating and generating heat, such cooling solutions may be particularly important.

One example of a cooling solution is a heat sink which relies on a heat transfer medium (e.g., a gas or liquid) to carry away the heat generated by a heat-generating electronic component. For instance, a cooling block (sometimes referred to as a "water block"), which is a liquid cooling heat sink, can be thermally coupled to a heat-generating electronic component and water (or other liquid) is made to flow through a conduit in the cooling block to absorb heat from the heat-generating electronic component. As water flows out of the cooling block, so does the thermal energy collected thereby.

However, some heat-generating electronic components such as CPUs are being designed to be more powerful and/or progressively smaller and therefore are becoming more power dense. As such, they produce more heat per unit surface area. Therefore, a cooling block that performed satisfactorily for absorbing heat from a less power dense electronic component may not perform as efficiently on a more power dense electronic component.

There is therefore a desire for a cooling block which can alleviate at least some of these drawbacks.

SUMMARY

It is an object of the present technology to ameliorate at least some of the inconveniences present in the prior art.

According to one aspect of the present technology, there is provided a cooling block assembly for cooling a heat-generating electronic component, comprising: an upper block portion defining at least one internal fluid conduit for circulating a cooling fluid therethrough, each of the at least one internal fluid conduit having an inlet and an outlet for receiving and discharging the cooling fluid respectively, the upper block portion having a lower surface configured to face toward the heat-generating electronic component; a boss connected to the upper block portion, the boss being spaced from the lower surface of the upper block portion, the boss having a thermal transfer surface configured to be in thermal contact with the heat-generating electronic component, the thermal transfer surface being offset from the lower surface in a height direction of the cooling block, the boss being dimensioned such that a periphery of the thermal transfer surface is smaller than a periphery of the upper block portion, the periphery of the thermal transfer surface being contained within the periphery of the upper block portion in a projection thereof on a plane parallel to the thermal transfer surface; and a plurality of heat distributing devices configured for distributing heat through a phase change of a working substance contained within each heat distributing device, each heat distributing device being disposed partially between the boss and the lower surface of the upper block portion to distribute heat from the boss to the lower surface.

In some embodiments, the heat distributing devices are one of: heat pipes, a phase change material and a loop thermosyphon.

In some embodiments, the heat distributing devices are heat pipes, each heat pipe comprising: a casing having a heat input surface in contact with the boss and a heat output surface opposite the heat input surface, the heat output surface being in contact with the lower surface of the upper block portion; and the working substance contained within the casing and configured to sequentially evaporate and condense to spread heat from the heat input surface to the heat output surface.

In some embodiments, the heat distributing devices are vapor chambers.

In some embodiments, a majority of the lower surface of the upper block portion is in contact with the heat output surfaces of the heat pipes.

In some embodiments, the upper block portion defines a plurality of recesses on a lower side thereof for receiving the heat distributing devices.

In some embodiments, notches are defined between the upper block portion and the boss to receive a part of respective ones of the heat distributing devices therein.

In some embodiments, for each heat distributing device, a majority of the heat distributing device is not disposed between the boss and the lower surface of the upper block portion.

In some embodiments, a ratio of an area defined by the periphery of the upper block portion over an area defined by the periphery of the thermal transfer surface is equal to or greater than 3.

In some embodiments, the ratio of the area defined by the periphery of the upper block portion over the area defined by the periphery of the thermal transfer surface is between 3 and 8 inclusively.

In some embodiments, the at least one fluid conduit includes a first fluid conduit and a second fluid conduit; the plurality of heat distributing devices includes a first heat distributing device and a second heat distributing device; the first heat distributing device is aligned with the first fluid conduit to distribute heat to the first fluid conduit; and the second distributing device is aligned with the second fluid conduit to distribute heat to the second fluid conduit.

In some embodiments, the upper block portion comprises a base and a cover connected to the base, the at least one internal fluid conduit being defined between the base and the cover.

In some embodiments, the at least one fluid conduit is a plurality of fluid conduits including a first fluid conduit and a second fluid conduit; the base is a first base and the cover is a first cover, the first base and the first cover defining the first fluid conduit therebetween; the upper block portion further comprises: a heat spreading base defining a plurality of pockets including a first pocket and a second pocket, the first base being received in the first pocket; a second base received in the second pocket; and a second cover connected to the second base, the second base and the second cover defining the second fluid conduit therebetween.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

It is to be understood that terms relating to the position and/or orientation of components such as "upper", "lower", "top", "bottom", "front", "rear", "left", "right", are used herein to simplify the description and are not intended to be limitative of the particular position/orientation of the components in use.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
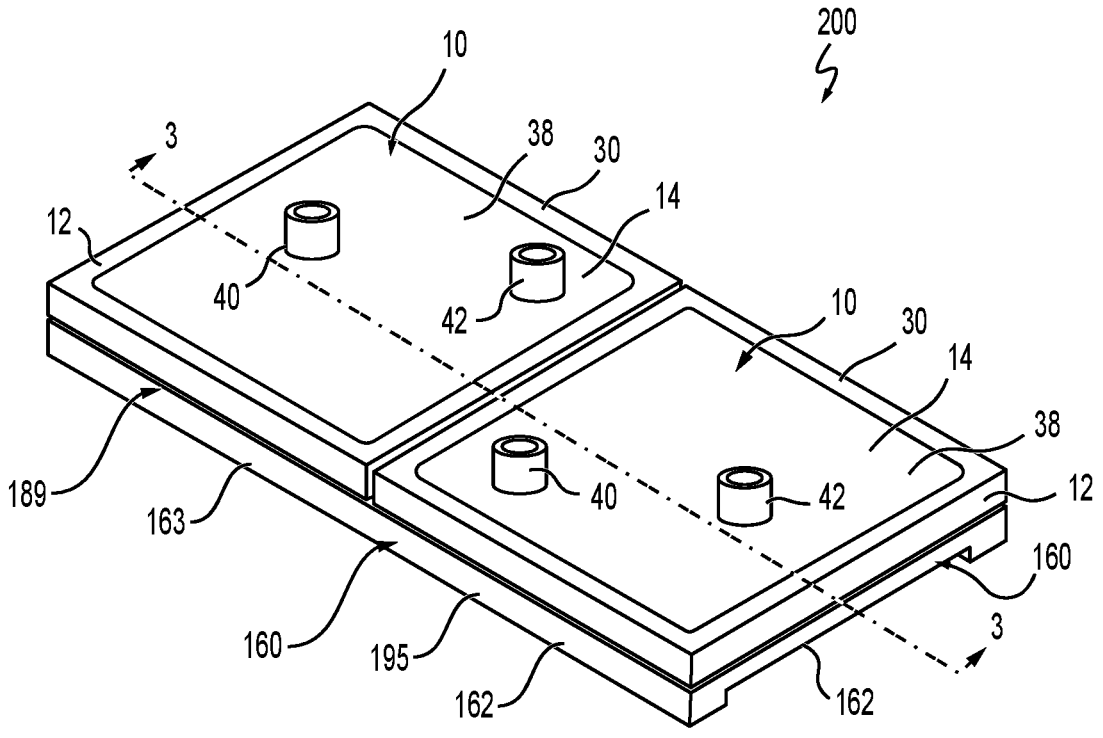
FIG. 1 is a perspective view, taken from a top, front, right side, of a cooling block assembly according to an embodiment of the present technology.

FIGS. 1 to 4 illustrate a cooling block assembly 200 in accordance with an embodiment of the present technology. The cooling block assembly 200 is configured for cooling a heat-generating electronic component 50 (illustrated schematically in FIG. 3). In this example, the heat-generating electronic component 50 is a central processing unit (CPU). For instance, the heat-generating electronic component 50 may be part of a server or other computer device operating within a data center. In use, the heat-generating electronic component 50 generates a significant amount of heat and can benefit from cooling. It is contemplated that the heat-generating electronic component 50 could be any other suitable heat-generating electronic component (e.g., a graphics processing unit (GPU), a memory component, a semi-conductor, etc.).

In this embodiment, the cooling block assembly 200 includes two cooling blocks 10, a heat spreading base 160 to which the cooling blocks 10 are mounted, and a plurality of heat distributing devices 250 connected to the heat spreading base 160. As will be explained in more detail below, the heat distributing devices 250 are configured for distributing heat through a phase change of a working substance contained therein.

An example configuration of the cooling blocks 10 will now be described. The cooling blocks 10 are identical to each other and therefore only one of the cooling blocks 10 will be described in detail herein. It is to be understood that a similar description applies to the other cooling block 10.

Figure 5:
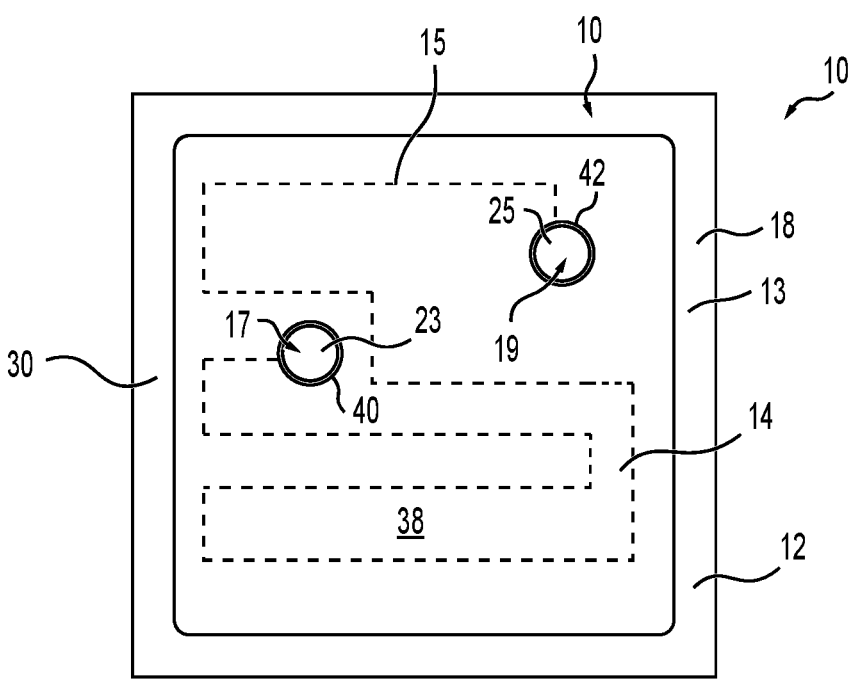
FIG. 5 is a top plan view of a part of a cooling block of the cooling block assembly of FIG. 1.

The cooling block 10 has a base 12 and a cover 14 connected to the base 12. Together, the base 12 and the cover 14 define an internal fluid conduit 15 (schematically illustrated in FIG. 5) within which a cooling fluid is circulated to absorb heat from the heat-generating electronic component 50. As shown in FIG. 5, the internal fluid conduit 15 extends from an inlet 17 to an outlet 19 of the cooling block 10. In this embodiment, the cooling fluid circulated through the internal fluid conduit 15 is demineralized water. However, the cooling fluid may be any other suitable cooling fluid (e.g., a refrigerant) in other embodiments. In some embodiments, the cooling fluid may be capable of two-phase flow such that the cooling fluid can change phases from liquid to gas and vice-versa based on a temperature thereof. The cooling fluid circulating within the cooling block 10 will thus, at some point, be in the liquid phase, however the cooling fluid may not necessarily be in liquid phase throughout (e.g., the cooling fluid may evaporate from liquid to gas when its temperature reaches a certain value).

Figure 3:
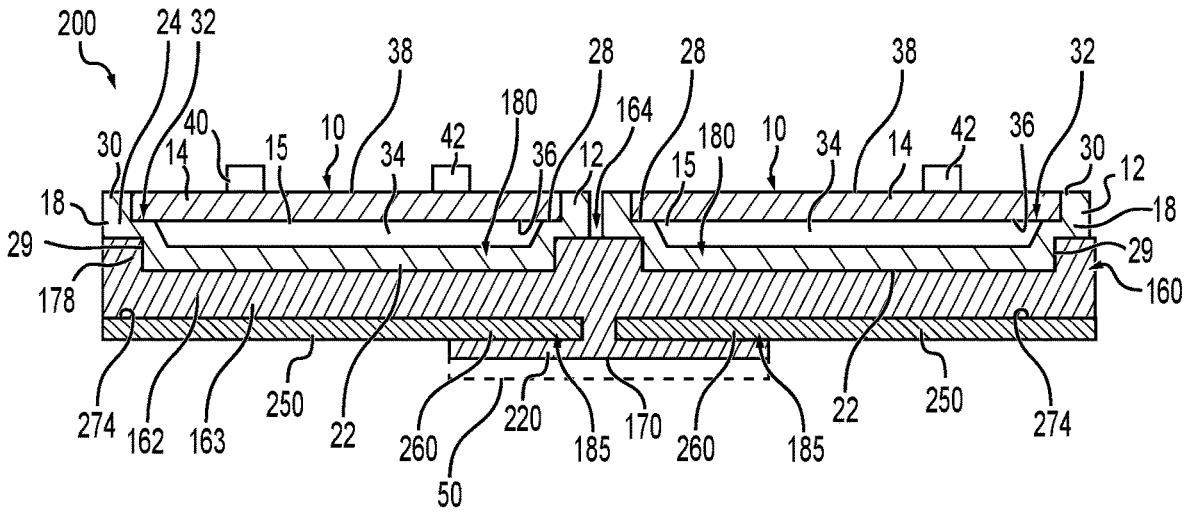
FIG. 3 is a cross-sectional view of the cooling block assembly of FIG. 1 taken along line 3-3 in FIG. 1.
Figure 6:
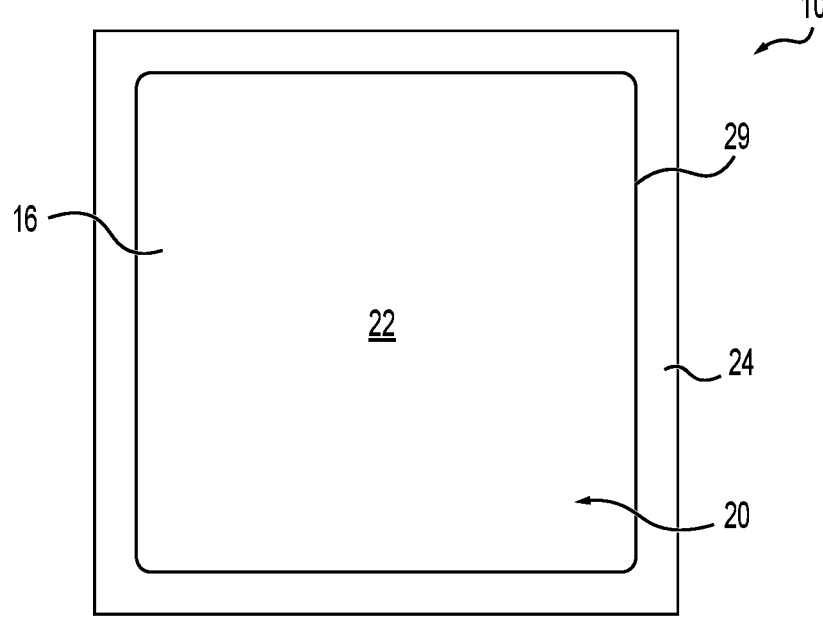
FIG. 6 is a bottom plan view of the cooling block of FIG. 5.

As best shown in FIGS. 3 and 6, the base 12 has a lower portion 16 and an upper portion 18 disposed above the lower portion 16. The lower portion 16 has a periphery that is smaller than a periphery of the upper portion 18 and, as such, the upper portion 18 forms a peripheral shoulder 24 that extends outwardly from an upper end of the lower portion 16. As shown in FIG. 6, the lower portion 16 is positioned generally centrally relative to the upper portion 18. In this embodiment, the lower portion 16 is generally square and thus has four outer surfaces. The lower portion 16 defines a thermal contact surface 22 of the cooling block 10, the thermal contact surface 22 being disposed on a lower side 20 of the base 12. The thermal contact surface 22 is the surface of the base 12 through which heat is primarily transferred to the cooling block 10. As such, in use, the thermal contact surface 22 is placed in thermal contact with another surface from which heat is to be absorbed.

As shown in FIG. 3, a pocket 32 is defined by the base 12 and is shaped and dimensioned to at least partly receive the cover 14 therein. Notably, in this embodiment, the pocket 32 is generally square as defined by the square shape of a retaining lip section 30 defining the pocket 32. In particular, the retaining lip section 30 and an upper base surface 28 of the base 12 define the pocket 32 together. The upper base surface 28 defines a channel 34 (FIG. 3) that forms in part the internal fluid conduit 15 of the cooling block 10. Notably, the channel 34 establishes a path of the internal fluid conduit 15 and thus guides the cooling fluid circulating therein through the cooling block 10 from the inlet 17 to the outlet 19. The channel 34 may have any suitable shape in different embodiments. For instance, the channel 34 may be shaped to define in part a serpentine path from the inlet 17 to the outlet 19.

In this embodiment, the cover 14 is a plate member that is generally planar and shaped to be received within the pocket 32. As shown in FIG. 5, the cover 14 defines an inlet opening 23 and an outlet opening 25 which correspond to the inlet 17 and the outlet 19 of the cooling block 10 respectively. As such, cooling fluid is respectively fed into and discharged from the internal fluid conduit 15 through the inlet and outlet openings 23, 25 of the cover 14. Inlet and outlet ducts 40, 42 are connected to the cover 14 at the inlet and outlet openings 23, 25 respectively to fluidly connect the internal fluid conduit 15 to an external cooling fluid source. For example, in a data center, the external cooling fluid source may comprise a circuit of cooling equipment including one or more dry coolers installed outside of the data center. As such, during use, in this embodiment, cooling fluid is continuously recirculated between the external cooling fluid source and the cooling block 10.

As shown in FIG. 3, the cover 14 is received in the pocket 32 of the base 12 with a lower surface 36 of the cover 14 facing the upper base surface 28. In particular, the lower surface 36 is placed in contact with the upper base surface 28. The internal fluid conduit 15 of the liquid cooling block 10 is thus defined by the lower surface 36 of the cover 14 and the channel 34 of the base 12. It is contemplated that, in some embodiments, the cover 14 could define a channel in the lower surface 36 complementary to the channel 34 of the base 12. Moreover, in other embodiments, the channel 34 could be omitted from the base 12 and the cover 14 could define the channel instead.

In this embodiment, the cover 14 has a thickness approximately equal to a height of the retaining lip section 30 such that, when the cover 14 is in place in the pocket 32, an upper (outer) surface 38 of the cover 14 is generally flush with the upper surface of the retaining lip section 30. Furthermore, in this embodiment, the cover 14 is welded to the base 12 along a periphery of the cover 14. For instance, the cover 14 may be laser welded to the base 12.

Figure 4:
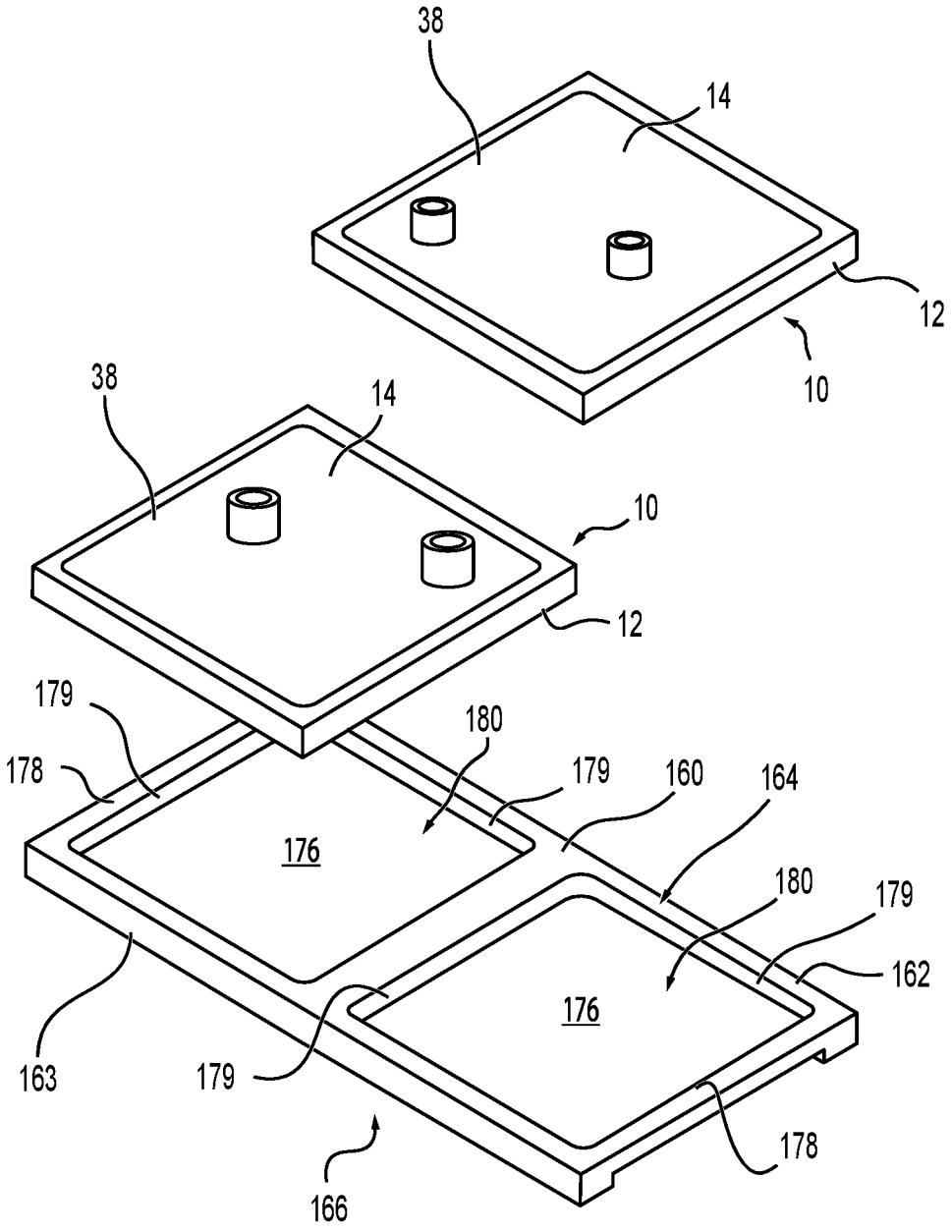
FIG. 4 is a partially exploded view of the cooling block assembly of FIG. 1.

With reference to FIG. 4, the heat spreading base 160 has a base body 162 having an upper side 164 and a lower side 166 opposite the upper side 164. The base body 162 has a main portion 163 which receives the cooling blocks 10. Notably, as best shown in FIG. 4, the main portion 163 has two upper base surfaces 176 on the upper side 164. Two retaining lip sections 178 extend upward from the upper base surfaces 176 and surround respective ones of the upper base surfaces 176. As such, the main portion 163 of the heat spreading base 160 defines two pockets 180, each pocket 180 being defined by one of the upper base surfaces 176 and a respective retaining lip section 178. The pockets 180 are shaped and dimensioned to at least partly receive the bases 12 of the cooling blocks 10.

In this embodiment, the two cooling blocks 10 are mated to the heat spreading base 160. More specifically, the lower portions 16 of the cooling blocks 10 are inserted into the corresponding pockets 180 of the heat spreading base 160. To that end, each pocket 180 is shaped and dimensioned such that, when the lower portion 16 of the respective cooling block 10 is inserted therein, inner surfaces 179 (FIG. 4) of the retaining lip section 178 defining the pocket 180 and the outer surfaces 29 (FIG. 6) of the lower portion 16 are in a close fit. The retaining lip sections 178 of the heat spreading base 160 thus surround the lower portions 16 of the corresponding cooling blocks 10 and thereby limit movement thereof relative to the heat spreading base 160 in horizontal directions (e.g., frontwards, backwards and laterally). Prior to the insertion of the lower portions 16 into the corresponding pockets 180, a thermal interface material may be applied on one or both of each of the thermal contact surfaces 22 and the upper base surfaces 176.

Returning now to FIG. 3, the base body 162 also has a boss 220 connected to the main portion 163. The boss 220 is disposed on the lower side 166 of the base body 162 and is spaced from a lower surface 167 of the main portion 163 in a height direction of the cooling block assembly 200. The lower surface 167 is on the lower side 166 of the heat spreading base 160 and is configured to face toward the heat-generating electronic component 50. As such, the boss 220 is disposed underneath the main portion 163 and may be referred to as a "lower block portion" while the main portion 163 of the heat spreading base 160 together with the cooling blocks 10 can be referred to as being an "upper block portion" 189 of the cooling block assembly 100. The upper block portion 189 thus defines the two internal fluid conduits 15, while the boss 220 is disposed underneath the upper block portion 189 and is the part of the cooling block assembly 200 that establishes the thermal contact with the heat-generating electronic component 50. Notably, the boss 220 defines a thermal transfer surface 170 which is configured to be placed in thermal contact with the heat-generating electronic component 50 (with a thermal interface material disposed therebetween). As such, the thermal transfer surface 170 is the surface of the heat spreading base 160 through which heat is primarily transferred to the cooling block assembly 100. The thermal transfer surface 170 is offset from the lower surface 167 of the upper block portion 189. In this example, the boss 220 and the thermal transfer surface 170 thereof are generally square.

Figure 2:
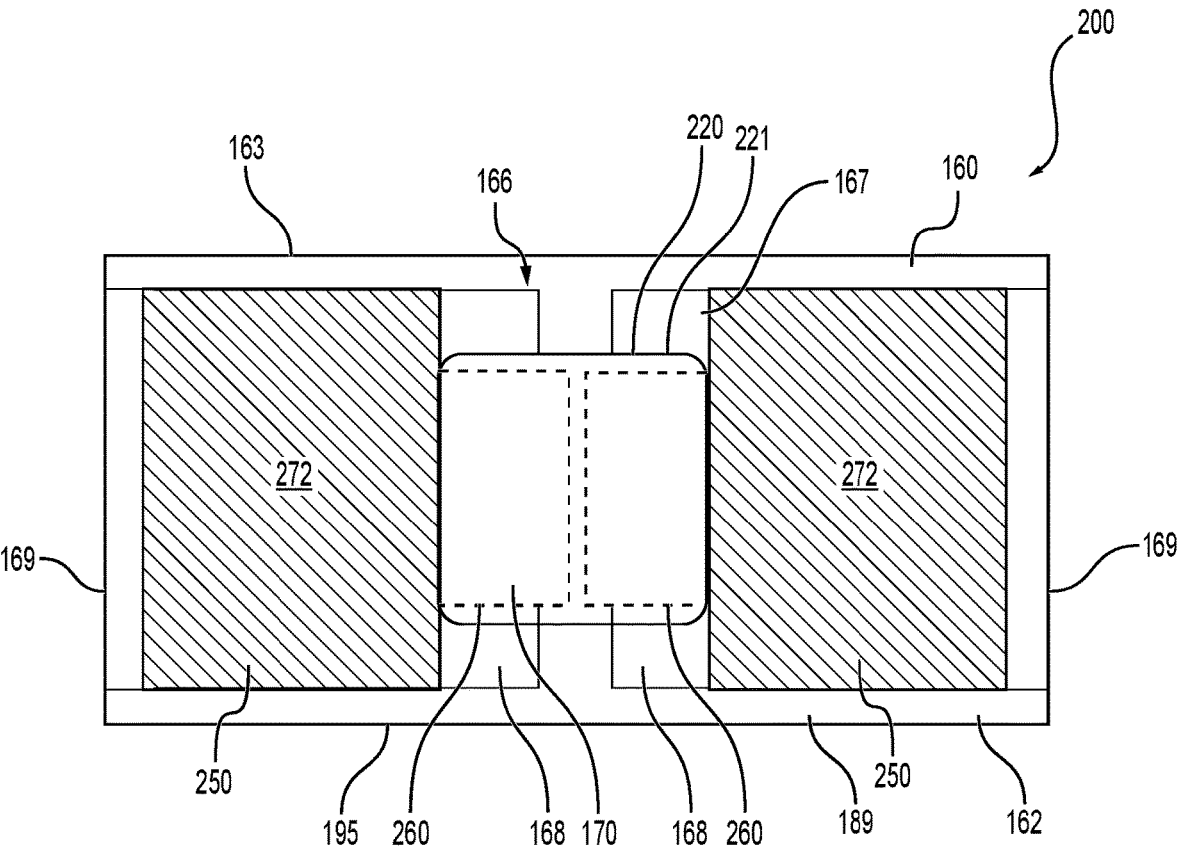
FIG. 2 is a bottom plan view of the cooling block assembly of FIG. 1.

As can be seen in FIG. 2, the dimensions of the boss 220 are significantly smaller than those of the upper block portion 189. Notably, the boss 220 is dimensioned to match the dimensions of the surface of the heat-generating electronic component 50. In particular, the boss 220 is dimensioned such that a periphery 221 of the thermal transfer surface 170 is smaller than a periphery 195 of the upper block portion 189. The periphery 195 of the upper block portion 189 is defined by the edges of the heat spreading base 160 that are normal to the thermal transfer surface 170. For instance, in this embodiment, a ratio of an area defined by the periphery 195 of the upper block portion 189 over an area defined by the periphery 221 of the thermal transfer surface 170 is equal to or greater than 3. In particular, in this example, the ratio of the area defined by the periphery 195 of the upper block portion 189 over the area defined by the periphery 221 of the thermal transfer surface 170 is between 3 and 8 inclusively.

Moreover, the boss 220 is generally centered in the longitudinal and lateral directions relative to the upper block portion 189. As such, the periphery 221 of the thermal transfer surface 170 is contained within the periphery 195 of the upper block portion 189 in a projection of the peripheries 221, 195 on a plane parallel to the thermal transfer surface 170.

Figure 8:
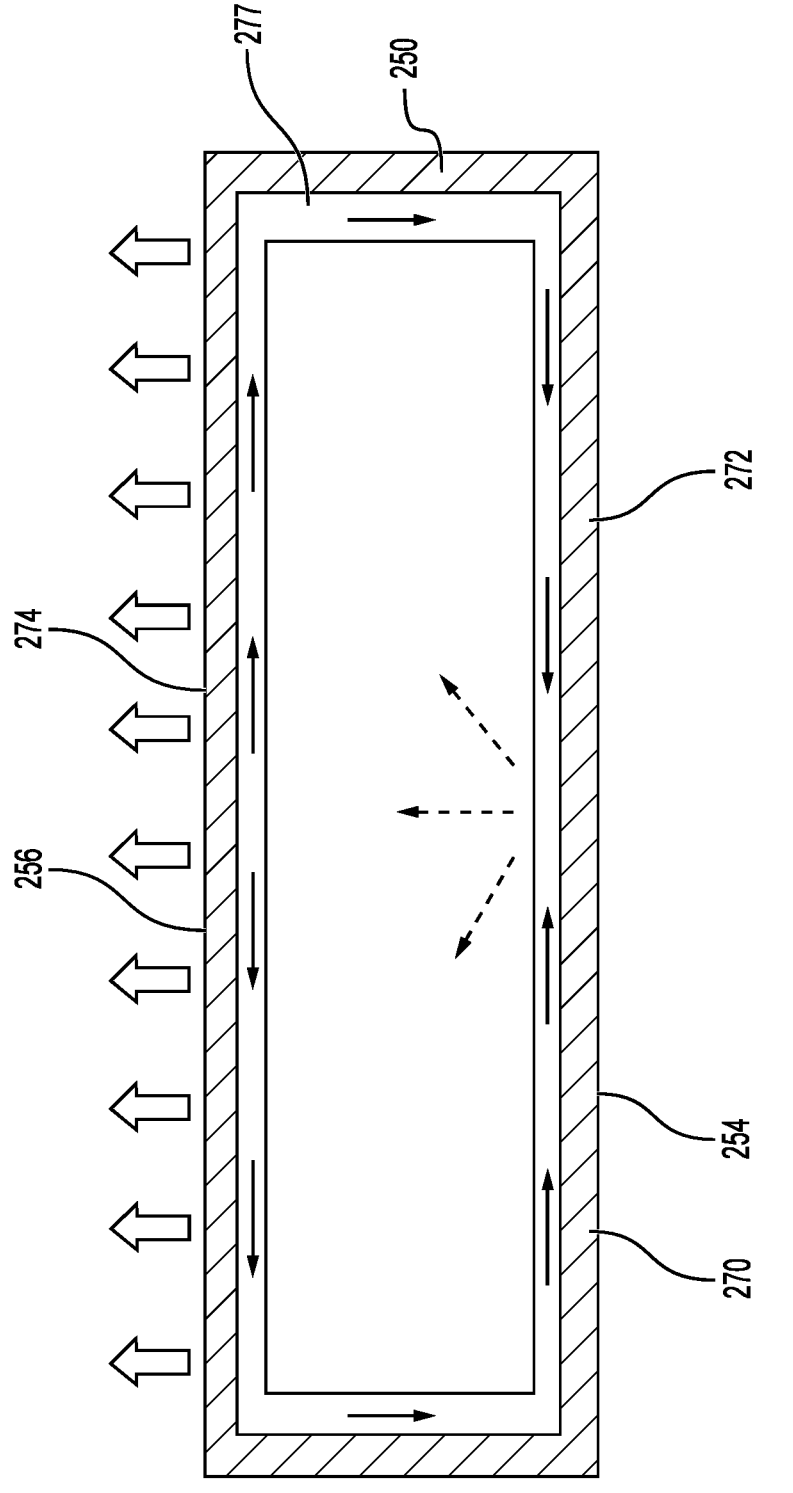
FIG. 8 is a diagram of one of a plurality of heat spreading devices of the cooling block assembly of FIG. 1.

With reference to FIGS. 3 and 8, the heat distributing devices 250 are configured for distributing heat through a phase change of a working substance contained within each heat distributing device 250. In this embodiment, two heat distributing devices 250 are provided and each heat distributing device 250 is aligned with a respective one of the internal fluid conduits 15. That is, each heat distributing device 250 is disposed underneath a respective one of the internal fluid conduits 15 to thereby spread heat to the corresponding internal fluid conduit 15. It is contemplated that, in some embodiments, a single internal fluid conduit 15 and the heat distributing devices 250 could thus be aligned with a part of the single internal fluid conduit 15.

As shown in FIGS. 2 and 3, in this embodiment, each heat distributing device 250 is disposed partially between the boss 220 and the lower surface 167 of the upper block portion 189 in order to distribute heat from the boss 220 to the lower surface 167. Notably, by positioning the heat distributing devices 250 in this manner, the heat distributing devices 250 can distribute the heat absorbed from the heat-generating electronic component 50 by the boss 220 to a larger surface, namely the lower surface 167, thereby providing efficient cooling of the heat-generating electronic component 50.

Figure 7:
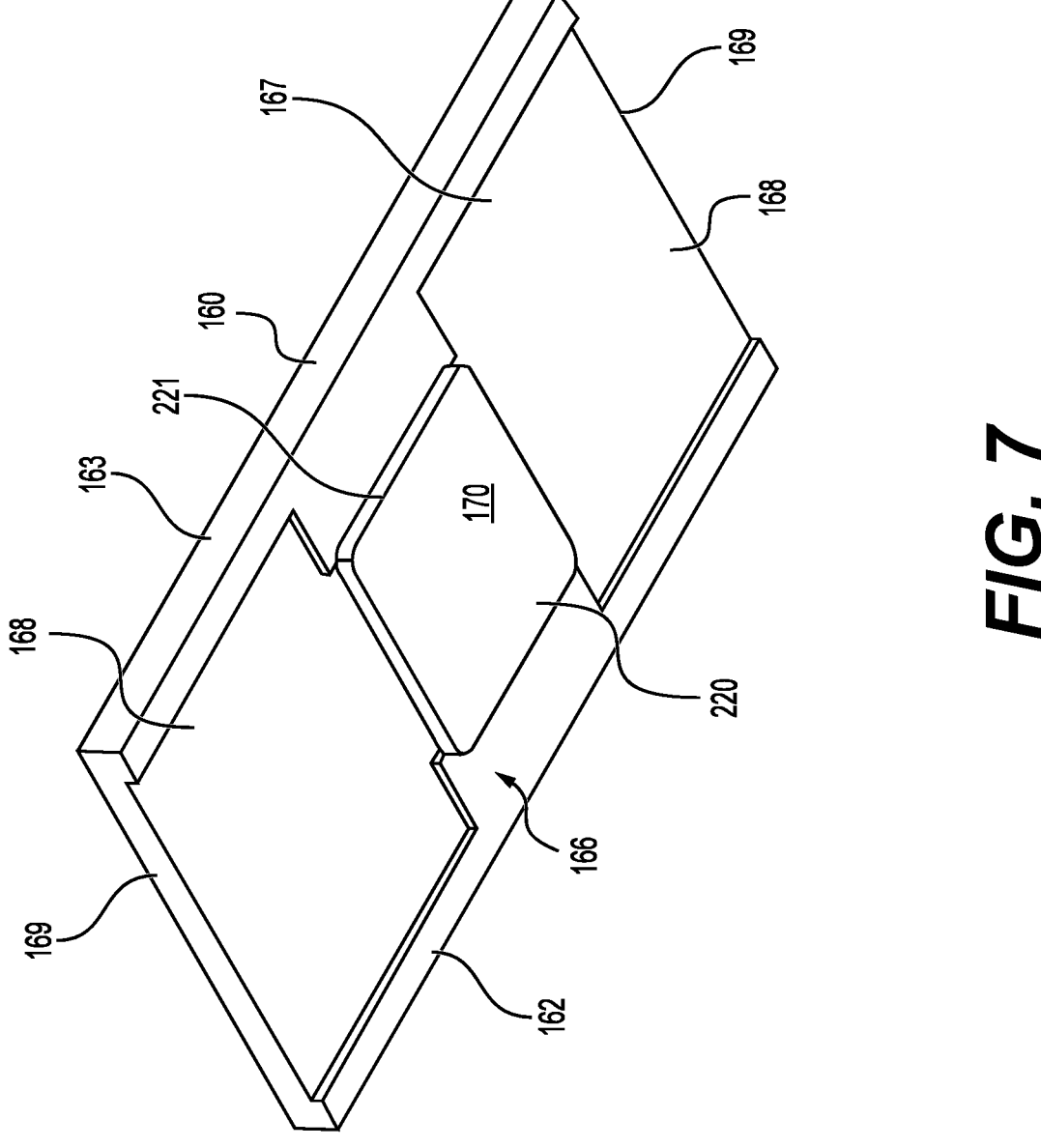
FIG. 7 is a perspective view, taken from a bottom, front, left side, of a heat spreading base of the cooling block assembly of FIG. 1.

As best shown in FIG. 7, in this example, the main portion 163 of the base body 162 defines two recesses 168 on the lower side 166 for receiving respective ones of the heat distributing devices 250. Moreover, in this example, each recess 168 extends to an edge 169 of the base body 162. This may facilitate the installation and positioning of the heat distributing devices 250 on the heat spreading base 160. In this embodiment, the heat distributing devices 250 are fastened to the heat spreading base 160. In particular, in this example, the heat distributing devices 250 are welded to the heat spreading base 160. The heat distributing devices 250 may be connected to the heat spreading base 160 in any other suitable way in other embodiments.

Furthermore, as best shown in FIG. 3, in this embodiment, the base body 162 defines two notches 185 between the lower surface 167 of the base body 162 and the boss 220. Each notch 185 receives a part 260 of a corresponding heat distributing device 250 therein such that the part 260 is disposed between the lower surface 167 and the boss 220. Each part 260 is a small proportion of the corresponding heat distributing device 250. Notably, each part 260 is less than half of the corresponding heat distributing device 250. As such, for each heat distributing device 250, a majority of the heat distributing device 250 is not disposed between the boss 220 and the lower surface 167.

In this embodiment, the heat distributing devices 250 are heat pipes. More specifically, in this example, the heat distributing devices 250 are vapor chambers (i.e., planar heat pipes). As such, with reference to FIG. 8, in this embodiment, each heat distributing device 250 functions on the basis of the working substance (e.g., water) contained therein evaporating at an evaporator side 254 of the heat distributing device 250 in response to being heated to a given temperature. The working substance thus changes phases from a liquid state to a gas state. The gasified working substance then travels to a condenser side 256 of the heat distributing device 250, opposite the evaporator side 254, where the heat is transferred from the working substance outwards to a colder surface with which the condenser side 256 is in contact (in this case, the lower surface 167). The working substance thus condenses back to a liquid and travels again, through a wick material 277 to the evaporator side 254.

As shown in FIG. 8, each heat distributing device 250 has a casing 270 which has a heat input surface 272 (on the evaporator side 254) and a heat output surface 274 opposite the heat input surface 272. A portion of the heat input surface 272 (comprised by the part 260) is in contact with the boss 220. The heat output surface 274 is in contact with the lower surface 167 of the upper block portion 189. The combined surface area of the heat output surfaces 274 of the two heat distributing devices 250 is relatively large such that a majority of the lower surface 167 of the upper block portion 189 is in contact with the heat output surfaces 274. As such, the heat distributing devices 250 spread the heat absorbed thereby to a large portion of the upper block portion 189. A thermal interface material may be applied between the heat input surface 272 of each of the heat distributing devices 250 and the boss 200, as well as between the heat output surface 274 of each of the heat distributing devices 250 and the lower surface 167.

The heat distributing devices 250 may be other types of heat pipes in other embodiments, including for example loop heat pipes. Furthermore, in other embodiments, the heat distributing devices 250 may be loop thermosyphons or phase changing materials.

Figure 9:
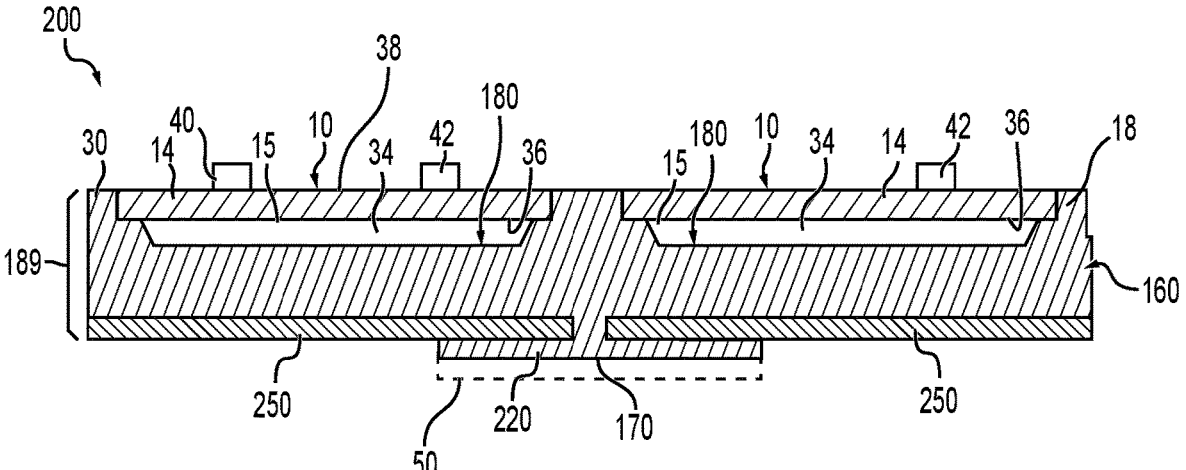
FIG. 9 is a cross-sectional view of the cooling block assembly according to an alternative embodiment.

While the cooling block assembly 200 has been shown and described as including two cooling blocks 10 and the heat spreading base 160, in other embodiments, the heat spreading base 160 may itself form the cooling blocks. For instance, with reference to FIG. 9, in an alternative embodiment, the channels 34 corresponding to the internal fluid conduits 15 are defined by the upper base surfaces 176 of the heat spreading base 160, and the pockets 180 receive the covers 14 directly therein. In other words, the bases 12 are omitted. In such cases, the upper block portion 189 comprises the heat spreading base 160 and the covers 14 which define the internal fluid conduits 15 therebetween. In cases in which the cooling block assembly 200 only has one internal fluid conduit 15, then a single cover 14 would be provided.

As will be appreciated from the above, the cooling block assembly 200 as described herein spreads the heat absorbed from the heat-generating electronic component 50 to a larger surface, namely the heat output surfaces 274 of the heat distributing devices 250, such that the cooling fluid circulated through the two internal fluid conduits 15 (or a larger single internal fluid conduit 15) can absorb the heat and carry it away as the cooling fluid is discharged. Therefore, the cooling block assembly 200 allows cooling a small and power dense heat-generating electronic component 50 which might otherwise be difficult for a cooling block of a size that corresponds to the size of the heat-generating electronic component 50.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A cooling block assembly for cooling a heat-generating electronic component, comprising:

an upper block portion defining at least one internal fluid conduit for circulating a cooling fluid therethrough, each of the at least one internal fluid conduit having an inlet and an outlet for receiving and discharging the cooling fluid respectively, the upper block portion having a lower surface configured to face toward the heat-generating electronic component;

a boss connected to the upper block portion, the boss being spaced from the lower surface of the upper block portion, the boss having a thermal transfer surface configured to be in thermal contact with the heat-generating electronic component, the thermal transfer surface being offset from the lower surface in a height direction of the cooling block assembly, the boss being dimensioned such that a periphery of the thermal transfer surface is smaller than a periphery of the upper block portion, the periphery of the thermal transfer surface being contained within the periphery of the upper block portion in a projection thereof on a plane parallel to the thermal transfer surface; and a plurality of heat distributing devices configured for distributing heat through a phase change of a working substance contained within each heat distributing device, each heat distributing device being disposed partially between the boss and the lower surface of the upper block portion to distribute heat from the boss to the lower surface.

2. The cooling block assembly of claim 1, wherein the heat distributing devices are one of: heat pipes, a phase change material and a loop thermosyphon.

3. The cooling block assembly of claim 2, wherein the heat distributing devices are heat pipes, each heat pipe comprising:

a casing having a heat input surface in contact with the boss and a heat output surface opposite the heat input surface, the heat output surface being in contact with the lower surface of the upper block portion; and the working substance contained within the casing and configured to sequentially evaporate and condense to spread heat from the heat input surface to the heat output surface.

4. The cooling block assembly of claim 1, wherein the heat distributing devices are vapor chambers.

5. The cooling block assembly of claim 3, wherein a majority of the lower surface of the upper block portion is in contact with the heat output surfaces of the heat pipes.

6. The cooling block assembly of claim 1, wherein the upper block portion defines a plurality of recesses on a lower side thereof for receiving the heat distributing devices.

7. The cooling block assembly of claim 1, wherein notches are defined between the upper block portion and the boss to receive a part of respective ones of the heat distributing devices therein.

8. The cooling block assembly of claim 1, wherein, for each heat distributing device, a majority of the heat distributing device is not disposed between the boss and the lower surface of the upper block portion.

9. The cooling block assembly of claim 1, wherein a ratio of an area defined by the periphery of the upper block portion over an area defined by the periphery of the thermal transfer surface is equal to or greater than 3.

10. The cooling block assembly of claim 9, wherein the ratio of the area defined by the periphery of the upper block portion over the area defined by the periphery of the thermal transfer surface is between 3 and 8 inclusively.

11. The cooling block assembly of claim 1, wherein:

the at least one internal fluid conduit includes a first fluid conduit and a second fluid conduit;

the plurality of heat distributing devices includes a first heat distributing device and a second heat distributing device;

the first heat distributing device is aligned with the first fluid conduit to distribute heat to the first fluid conduit; and the second heat distributing device is aligned with the second fluid conduit to distribute heat to the second fluid conduit.

12. The cooling block assembly of claim 1, wherein the upper block portion comprises a base and a cover connected to the base, the at least one internal fluid conduit being defined between the base and the cover.

13. The cooling block assembly of claim 12, wherein:

the at least one internal fluid conduit is a plurality of fluid conduits including a first fluid conduit and a second fluid conduit;

the base is a first base and the cover is a first cover, the first base and the first cover defining the first fluid conduit therebetween;

the upper block portion further comprises:

a heat spreading base defining a plurality of pockets including a first pocket and a second pocket, the first base being received in the first pocket;

a second base received in the second pocket; and a second cover connected to the second base, the second base and the second cover defining the second fluid conduit therebetween.

* * * * *